United States Patent
Wang et al.

(10) Patent No.: US 9,746,538 B2
(45) Date of Patent: Aug. 29, 2017

(54) REFERENCE OVERSAMPLING IN SENSE-TYPE MAGNETIC RESONANCE RECONSTRUCTION

(71) Applicant: Siemens Healthcare GmbH, Erlangen (DE)

(72) Inventors: Qiu Wang, Princeton, NJ (US); Derya Gol Gungor, Columbus, OH (US); Michael Zenge, Nürnberg (DE); Marcel Dominik Nickel, Herzogenaurach (DE); Edgar Müller, Heroldsbach (DE); Mariappan S. Nadar, Plainsboro, NJ (US)

(73) Assignee: Siemens Healthcare GmbH, Erlangen (DE)

(*) Notice: Subject to any disclaimer, the term of this patent is extended or adjusted under 35 U.S.C. 154(b) by 486 days.

(21) Appl. No.: 14/458,381

(22) Filed: Aug. 13, 2014

(65) Prior Publication Data

US 2015/0054505 A1     Feb. 26, 2015

Related U.S. Application Data

(60) Provisional application No. 61/868,187, filed on Aug. 21, 2013.

(51) Int. Cl.
*G01R 33/565* (2006.01)
*G01R 33/561* (2006.01)

(52) U.S. Cl.
CPC .... *G01R 33/56545* (2013.01); *G01R 33/5611* (2013.01)

(58) Field of Classification Search
CPC ............ G01R 33/56545; G01R 33/5611
See application file for complete search history.

(56) References Cited

U.S. PATENT DOCUMENTS

| | | | | |
|---|---|---|---|---|
| 8,587,307 B2* | 11/2013 | Ying | ................. | G01R 33/5611 324/307 |
| 2011/0148413 A1* | 6/2011 | Miyazaki | ............ | G01R 33/482 324/309 |

OTHER PUBLICATIONS

P. F. Ferreira, et al., "Cardiovascular magnetic resonance artefacts," Journal of Cardiovascular Magnetic Resonance 15:41, pp. 1-39, 2013.
M. A. Griswold, et al., "Generalized Autocalibrating Partially Parallel Acquisitions (GRAPPA)," Magnetic Resonance in Medicine 47, pp. 1202-1210, 2002.
M. A. Griswold, et al., "Field-of-View Limitations in Parallel Imaging," Magnetic Resonance in Medicine 52, pp. 1118-1126, 2004.
K. P. Pruessmann, et al., "SENSE: Sensitivity Encoding for Fast MRI," Magnetic Resonance in Medicine 42, pp. 952-962, 1999.
M. Uecker, et al., "ESPIRiT Reconstruction Using Soft SENSE," Proc. Intl. Soc. Mag. Reson. Med. 21, p. 0127, 2013.
Q. Wang, et al., "An Eigen-Vector Approach for Coil Sensitivity Estimation in the 3D Scenario," Proc. Intl. Soc. Mag. Reson. Med. 21, p. 2674, 2013.

* cited by examiner

*Primary Examiner* — Gregory H Curran

(57) ABSTRACT

Magnetic resonance imaging uses regularized SENSE reconstruction for a reduced field of view, but minimizes folding artifacts. A reference scan is oversampled relative to the reduced field of view. The oversampling provides coil sensitivity information for a region greater than the reduced field of view. The reconstruction of the object for the reduced field of view using the coil sensitivities for the larger region may have fewer folding artifacts.

19 Claims, 2 Drawing Sheets

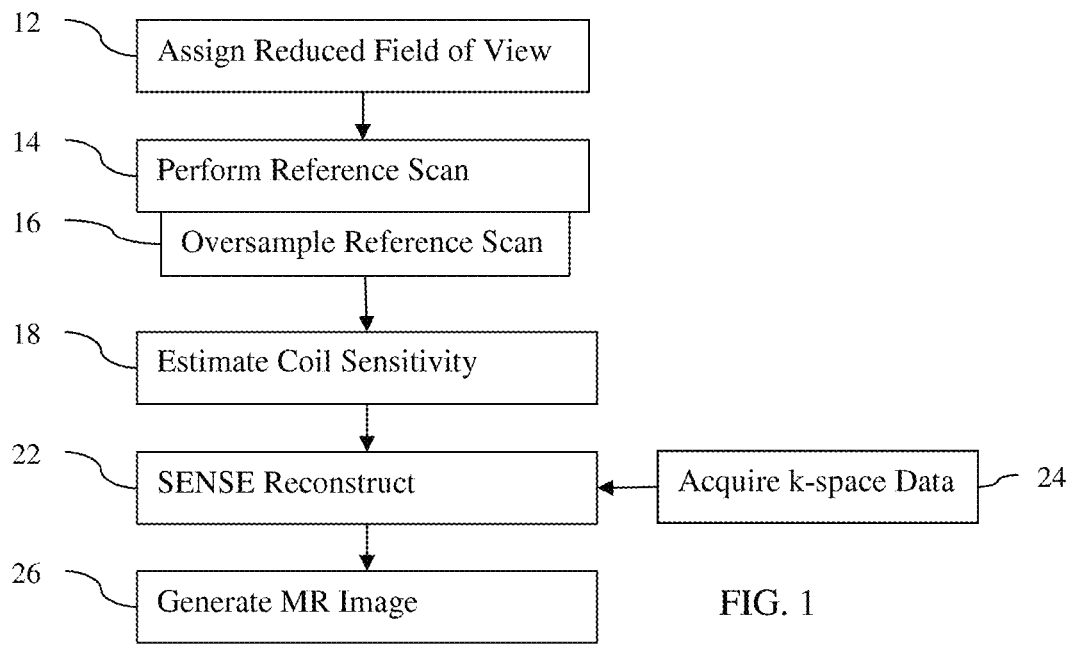
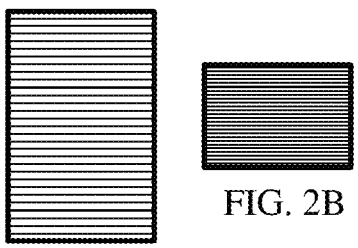
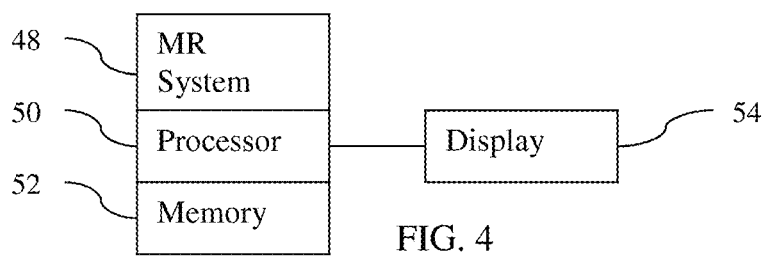

(A)     (B)     (C)     (D)     (E)

REFERENCE OVERSAMPLING IN SENSE-TYPE MAGNETIC RESONANCE RECONSTRUCTION

RELATED APPLICATIONS

The present patent document claims the benefit of the filing date under 35 U.S.C. §119(e) of Provisional U.S. Patent Application Ser. No. 61/868,187, filed Aug. 21, 2013, which is hereby incorporated by reference.

BACKGROUND

The present embodiments relate to magnetic resonance imaging (MRI). In particular, sensitivity encoding (SENSE) reconstruction in MRI for a reduced field of view is provided.

In applications such as cardiac imaging, it is sometimes beneficial to select a smaller field-of-view (FOV) as compared to the size of the whole object (e.g., patient). This reduced FOV may allow an increase in image resolution and/or save data acquisition time.

Reduced FOV (rFOV) with SENSE reconstruction causes extra folding in the image domain around the edges of the image. This folding is in addition to the folding due to subsampling for parallel imaging. SENSE-like methods may not resolve the aliasing appropriately under reduced FOV unless denser sampling grids are used for coil sensitivity estimation.

Coil-by-coil reconstruction methods, such as GRAPPA, are robust to FOV limitations because the interpolation kernels may have more localized shapes than the coil sensitivities. These localized shapes may be well-represented in sparse sampling grids. However, GRAPPA reconstructions exhibit noise in high acceleration rates. Noise may be mitigated in SENSE via regularization.

BRIEF SUMMARY

By way of introduction, the preferred embodiments described below include methods, systems, instructions, and computer readable media for magnetic resonance imaging. A reference scan is oversampled relative to a reduced field of view. The oversampling provides coil sensitivity information for a region greater than the reduced field of view. The reconstruction of the object for the reduced field of view using the coil sensitivities for the larger region may have fewer folding artifacts.

In a first aspect, a method is provided for magnetic resonance imaging. A reduced field of view for sensitivity encoding (SENSE) reconstruction is assigned. The field of view is reduced from an entire patient to a sub-region of the patient along at least one spatial dimension. A magnetic resonance system performs a reference scan for the sensitivity encoding (SENSE) reconstruction. The reference scan is oversampled in a direction of the reduced field of view. The coil sensitivity of a coil of the magnetic resonance system is determined from the oversampled reference scan for the FOV larger than the reduced field of view so that the estimated coil sensitivity covers a region greater than the reduced field of view along the direction. A regularized SENSE reconstruction is performed using the estimated coil sensitivity maps to generate a magnetic resonance image.

In a second aspect, a non-transitory computer readable storage medium has stored therein data representing instructions executable by a programmed processor for magnetic resonance imaging with sensitivity encoding (SENSE) reconstruction. The storage medium includes instructions for: oversampling, with a magnetic resonance system, a reference scan of a patient relative to a reduced field of view; determining an encoding matrix from the oversampled reference scan of the patient; and reconstructing an image of the patient as a function of the encoding matrix.

In a third aspect, a magnetic resonance system is provided. A processor is configured to reconstruct a reduced field of view image of a patient with coil sensitivities of a plurality of coils for a region of the patient that is greater than the reduced field of view.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

FIG. 1 is a flow chart diagram of one embodiment of a method for magnetic resonance reconstruction;

FIG. 2A illustrates an example sampling pattern for a fully sampled reduced field of view, and FIG. 2B illustrates an example sampling pattern with two times oversampling along the phase encoding direction, which is considered as the vertical direction in this example;

FIG. 4 is one embodiment of a magnetic resonance system.

DETAILED DESCRIPTION OF THE DRAWINGS AND PRESENTLY PREFERRED EMBODIMENTS

Figure 3:
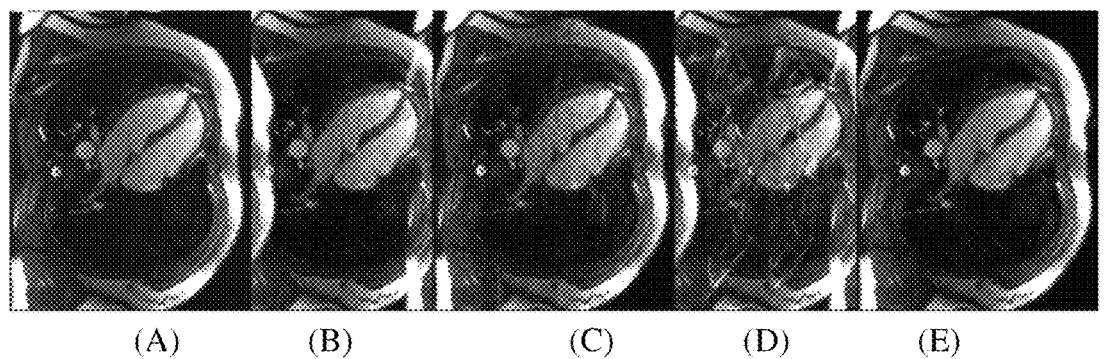
FIGS. 3A-E show example images reconstructed using different techniques.

Oversampled reference data is used for coil sensitivity estimation in conjunction with a regularized SENSE reconstruction algorithm to deal with reduced FOV artifacts and noise in parallel imaging. For example, the reference data is oversampled by a factor of 2 for coil sensitivity estimation. Combined with a regularized SENSE-based reconstruction algorithm, oversampling the reference may reduce or remove the wrap-in artifacts, while preserving signal-to-noise ratio, as compared to GRAPPA and soft-SENSE.

FIG. 1 shows a flow chart of a method for magnetic resonance reconstruction. The method is implemented by the system of FIG. 4 or another system. For example, the method is implemented on a computer or processor associated with a MRI system or PACS. A user input, display, and/or processor assign a reduced field of view in act 12. The magnetic resonance system, using coils connected with transmitters and receivers, performs the reference scan and acquisition of k-space data in acts 14, 16 and 24. A processor performs the remaining acts. Other distributions of functions among components may be used.

The acts are performed in the order shown or other orders. For example, acts 12-20 are performed in sequence, then act 24, and then acts 22 and 26. The acts are performed with the patient in the MRI system, such as laying in a generally uniform main magnetic field.

Additional, different, or fewer acts may be provided. For example, the display of an image in act 26 is not provided, but instead the image is stored or transmitted. As another example, other acts representing processes for SENSE reconstruction, such as L1-regularlized reconstruction, are provided. Filtering or other image processes may be used. In yet another example, the application of gradients or other magnetic resonance scan acts are provided.

In general, FIG. 1 is directed to SENSE reconstruction for magnetic resonance imaging of a patient. The reconstruction is of a reduced field of view, such as associated with imaging specific to an organ or sub-part of the patient (e.g., cardiac MR). To avoid or limit folding artifacts due to the reduced field of view, the coil sensitivity for a larger region than the field of view is used. By oversampling the reference scan along a direction of the reduction of the field of view, the coil sensitivities for the larger region are estimated and used in the reconstruction.

In act 12, a reduced field of view is assigned. A complete or full field of view is the entire patient or at least the patient from the neck to the upper legs. The arms may or may not be considered part of the full field of view. Any patient tissue effects the detection of magnetic resonance. When the full field of view is considered, these effects are accounted for. When the field of view is reduced along one or more spatial dimensions, then the effects may not be accounted for as well.

The field of view is reduced to be a sub-part of the patient. For example, the field of view is reduced to be just the chest region of the patient for cardiac imaging (e.g., four chamber view). This reduction is along the axial direction of the patient (alteration in superior and/or inferior extent). Reduction along other axes, such as left-right or posterior-superior orthogonal axes may be used. As another example, the field of view is reduced to include the liver and surrounding tissues, but to not include the lungs, heart, or other upper body organs. Any now known or later developed reduced fields of view may be used, such as reduced fields of view for SENSE reconstruction. SENSE-type reconstruction where the data is acquired for a field of view smaller than the scan object itself is a reduced field of view.

The reduced field of view is assigned by a processor or loaded from memory. For example, a scan protocol is selected by a user or based on a patient order. The scan protocol defines the field of view relative to the patient and/or the magnetic resonance system. The magnetic resonance system is configured to scan in the reduced field of view by the processor. As another example, the user selects the reduced field of view, such as sizing a shape, graphic or box over an image or images of the patient. The indication of region of interest location relative to the patient provides the reduced field of view. In one embodiment, the user selects a cardiac imaging scan protocol and then confirms a processor determined or positions a user determined region of interest over the heart or other cardiac region of the patient. The region of interest is assigned as the reduced field of view. In yet another example, the processor performs image processing to locate the region of interest in the patient and corresponding reduced field of view.

In act 14, a reference scan is performed by the magnetic resonance system. For SENSE or SENSE types of scans, a reference scan is used for estimating coil sensitivity. By transmitting from and/or receiving signals at any of the coils to be used for MRI, the coil sensitivity as positioned on a specific patient may be estimated from k-space data. The reference scan samples the low frequency of the k-space data at the Nyquist sampling rate. While the patient is in the main magnetic field and prior, during, or after acquiring k-space data for reconstruction, the reference scan is performed. Any now know or later developed reference scan technique may be used. Normally, reference data is acquired at the Nyquist sampling rate, which is the normal sampling rate. In the data scan, in order to save scan time, the k-space data is undersampled (below the Nyquist rate). For oversampling used herein, the reference scan is sampled above the Nyquist rate.

The reference scan may be performed more rapidly by acquiring less data. For example, the k-space data for the reference scan is obtained with a lower resolution than used for acquiring k-space data for reconstruction in act 24. Any resolution may be used, including equal or greater resolution, for the reference scan relative to the reconstruction scan.

In act 16, the reference scan is performed by the magnetic resonance system, at least in part, with oversampling. The oversampling is with respect to the reduced field of view. The oversampling occurs for any direction or dimension along which the reduction occurs. For example, FIG. 2A shows a sampling for the reference scan with the axial dimension of the patient represented as vertical. FIG. 2B shows a two times oversampling along the axial dimension. In other embodiments, the oversampling occurs along two or more orthogonal dimensions, such as for any dimension in which patient tissue exists outside of the reduced field of view along that direction. The reference data is oversampled along the direction or directions in which the field of view is decreased in the assigned reduced field of view.

The oversampling is along the phase encoding (PE) direction, because this is the direction where the FOV is reduced. In MRI there are three spatial directions: Frequency encoding, phase encoding and partition encoding (sometimes also called the $2^{nd}$ phase encoding). The frequency encoding is normally oversampled (sampled above the Nyquist rate), thus won't be affected even when the FOV along this direction is smaller than the patient size. The phase encoding and the partition encoding directions are normally sampled with a density grid that equals to the Nyquist sampling rate. Therefore, when the FOV is smaller than the patient size in these two directions, reduced FOV wrap-in artifacts occur. The oversampling may be along the partition encoding direction.

Any amount of oversampling may be provided. For example, the oversampling is by a factor of about two. About is used to account for tolerances due to coil placement, type of coil, the magnetic resonance system, or other contributors to intended verses resulting oversampling factor. Oversampling by other integer or fractional amounts may be used, such as by 1.5 or 3.0.

Regular or full sampling corresponds to sampling for the reduced field of view. The reduced field of view is oversampled by acquiring k-space data corresponding to locations outside the reduced field of view. The oversampling results in acquisition of k-space data as reference data for a region larger than the reduced field of view. Instead of acquiring the reference data for the reduced field of view, the reference data is acquired for a larger region including the reduced field of view. The larger region may correspond to the full field of view (e.g., entire patient along a dimension), more than the full field of view (e.g., include information from air, arms, or other objects beyond the patient), or a larger sub-set of the patient (e.g., less than the full but more than the reduced). The spatial extent is controlled by the oversampling factor. For example, an oversampling factor of two may result in the region being twice the size of the reduced field of view. Due to the line density or other changes, there may not be a 1:1 ratio of oversampling factor to region size.

In one embodiment, the oversampling acquires the reference data with a same amount of k-space center as if the reference scan were performed directly for the reduced field of view (i.e., as if performed without the oversampling). To save time or prevent the oversampled acquisition from taking more time than without the oversampling, the same number of lines is acquired. For example, twenty four central lines are reserved for coil sensitivity estimation. FIG. 2A represents a given number of lines. For oversampling, the same number of lines are used, but with the distance between the lines (i.e., step size) reduced in k-space, as represented by FIG. 2B. This more dense line distribution in the frequency domain of the k-space data results in a larger field of view in object space. As long as the number of reference lines remains the same, oversampling the reference data does not cause any increase in the acquisition time. In alternative embodiments, a different number of lines are used for the oversampling than as compared to sampling for the reduced field of view. The oversampling may be configured to take more or less time than a given configuration of full sampling of the reduced field of view.

In act 18, an encoding matrix is determined by a processor from the oversampled reference scan of the patient. The encoding matrix represents the magnetic resonance system in the SENSE reconstruction. As such, the encoding matrix includes an estimate of the coil sensitivity for each of the coils being used. The encoding matrix may also include terms for the forward Fourier transform and a subsampling operator. Additional, different, or fewer terms may be included in the encoding matrix.

The coil sensitivity for each coil is estimated from the k-space data acquired in the oversampled reference scan. Any derivation of coil sensitivity from k-space data may be used, such as estimating using an eigenvector method.

The coil sensitivity is estimated for the region greater than the reduced field of view due to the oversampling. For example with an oversampling factor of two, the region is twice as large in real space than the reduced field of view size.

Where the field of view is reduced along more than one direction, the resulting estimates of coil sensitivity are for a region greater than the reduced field of view along those multiple directions. For example, the field of view is reduced along the axial and lateral directions relative to the patient. The coil sensitivity is then estimated, using the oversampling, for locations extending beyond the reduced field of view for those two directions. For any direction without reduction in the field of view (e.g., front to back), oversampling is not performed and the coil sensitivity is estimated for that field of view.

For parallel image reconstruction using two or more coils, the coil sensitivity is estimated for each of the coils. The same transmission sequence for the reference scan is used, but the coil sensitivity is estimated from the k-space data received separately at each respective coil. Alternatively, separate transmissions and k-space measurements are performed for each of the coils.

The coil sensitivity may be masked for use in the reconstruction. By oversampling, coil sensitivity estimates are provided for locations beyond the reduced field of view. These locations may be entirely within the patient, so masking is not needed. Where some of the locations are beyond or outside of the patient, masking may be used to eliminate values corresponding to background. In one embodiment, the mask is obtained by thresholding the maximum eigenvalues in an eigenvector approach. Other approaches may be used.

In act 24, k-space data is acquired for reconstruction. The k-space data for reconstruction is different data than used for the reference scan. Alternatively, the reference scan is used as some of the k-space data for reconstruction.

The k-space data is acquired by scanning a patient. In response to application of magnetic fields and one or more pulses, data representing an interior region of a patient is acquired. For example, the k-space data is acquired using a time-interleaved, multi-coil dynamic imaging sequence of pulses. As another example, the k-space data is acquired as frames or shot divisions of k-space data. Any now known or later developed MR scan sequence may be used.

In act 22, an image of the patient is reconstructed. SENSE reconstruction is performed. The image is directly estimated from the k-space data, such as solving a least square problem. For example, L1 regularized SENSE reconstruction is used. Any now known or later developed SENSE reconstruction may be used.

In one embodiment, the regularized SENSE reconstruction is represented as:

$$\hat{x}=\mathrm{argmin}_x \|y-Ex\|^2+\lambda\|Wx\|_1$$

where E is the encoding matrix, W is the wavelet transform, $\lambda$ is the regularization coefficient, x is the image to be reconstructed, and y is the k-space observations acquired in act 24. Any minimization function may be used. The image is reconstructed as voxels representing a three-dimensional distribution of magnetic resonance response throughout the patient. Alternatively, plane of the object is reconstructed. The reconstruction is a function of the encoding matrix, which includes the coil sensitivity distribution.

The reconstruction is the image of extended field of view, which corresponds to oversampling rate times the reduced field of view. This covers the entire patient plus some background region. It is expected to be a completely unfolded image and does not include any aliasing. The background region may later be cropped to reduce the size of the image.

The reconstruction is performed for an acceleration factor. The pMRI acceleration factor corresponds to the subsampling factor of the reduced field of view data. To account for—the reduced field of view, the reconstruction is performed using an acceleration factor which is a multiple of pMRI acceleration rate and oversampling rate. For example, with oversampling of 2 and pMRI acceleration rate of R, the acceleration factor of 2R is used with SENSE algorithm. Other acceleration factors or no acceleration may be used.

The reconstruction is a parallel reconstruction. K-space data from a number of coils (e.g., two or more) is used in the reconstruction. The image for each coil is reconstructed separately or one image is reconstructed with k-space data from the multiple coils. For example, sum-of-square coil combination, adaptive coil combination, or other combination may be used. By combining for all coils or a sub-set of coils selected based on Eigen-channels, an output image is generated.

In act 26, a magnetic resonance image is generated from the SENSE reconstruction. The image is a reconstruction of the patient from the k-space observations. The image represents an interior region of the patient. The image is a two-dimensional image or a three-dimensional rendering to a two-dimensional display from voxel data representing three-dimensions. The reconstruction provides a distribution, from which the image is generated (e.g., rendered).

The image is displayed on a display of an MRI system. Alternatively, the image is displayed on a workstation, computer or other device. The image may be stored in and recalled from a PACS memory.

The image represents the reduced field of view of the patient. For example, the image is just of the cardiac or other organ specific region of the patient. The image is of less than the entire patient. One or more dimensions of the image may show tissue or fluid in the patient, but not skin, since the reduced field of view is internal, at least along one dimension, to the patient.

FIG. 3 shows example planar images of a cardiac region of a patient. The images are reconstructed using the same k-space data, but different oversampling and/or reconstruction methods. FIG. 3A shows an example full-field of view, sum of squares image of a reduced field of view as a ground truth. FIG. 3B shows an image reconstructed for the reduced field of view using GRAPPA. FIG. 3C shows an image reconstructed for the reduced field of view with GRAPPA with 2R acceleration via oversampling of the reference. FIG. 3D shows an image reconstructed with SENSE for the reduced field of view without oversampling. FIG. 3E shows an image reconstructed for the reduced field of view with regularized SENSE with 2R acceleration via oversampling of the reference. FIGS. 3C and E are cropped from both sides along the phase encoding direction (horizontal in the image) to eliminate regions with zero pixel values used to simulate the reconstruction with oversampling.

GRAPPA avoids the folding artifact in the region of interest, but suffers from noise. As shown by comparing FIGS. 3D and 3E, oversampling may reduce the folding artifact in SENSE reconstruction. FIGS. 3D and 3E may provide a reconstructed image with better noise characteristics than FIGS. 3B and 3C but with less or no folding artifact. FIG. 3E demonstrates that the SENSE reconstructed image may be free of folding-type aliasing artifacts and have an improved signal-to-noise ratio as compared to GRAPPA reconstruction of the reduced field of view.

FIG. 4 shows a system for magnetic resonance reconstruction. The system includes an MR system 48, a memory 52, a processor 50, and a display 54. Additional, different, or fewer components may be provided. For example, a network or network connection is provided, such as for networking with a medical imaging network or data archival system. In another example, a user interface is provided.

The processor 50 and display 54 are part of a medical imaging system, such as the MR system 48. Alternatively, the processor 50 and display 54 are part of an archival and/or image processing system, such as associated with a medical records database workstation or server. In other embodiments, the processor 50 and display 54 are a personal computer, such as desktop or laptop, a workstation, a server, a network, or combinations thereof. The processor 50, display 54, and memory 52 may be provided without other components for implementing reference oversampling in reduced field of view MRI.

The MR system 48 includes one or more coils. For example, a plurality of coils is provided, such as an array of local coils. The MR system 48 includes a main field magnet, such as a cryomagnet, and gradient coils. Other processing components may be provided, such as for planning and generating transmit pulses for the coils based on the sequence and for receiving and processing the received k-space data. In one embodiment, the MR system 48 is a 1.5T clinical MR scanner, such as a MAGNETOM Aera, from Siemens AG, Erlangen, Germany. MR scanners from other manufactures and/or with other main field strengths may be used.

The memory 52 is a graphics processing memory, a video random access memory, a random access memory, system memory, random access memory, cache memory, hard drive, optical media, magnetic media, flash drive, buffer, database, combinations thereof, or other now known or later developed memory device for storing data or image information. The memory 52 is part of the MR system 48, part of a computer associated with the processor 50, part of a database, part of another system, a picture archival memory, or a standalone device.

The memory 52 stores data representing a region of a patient. The data is MR data, such as k-space or object space data. The region is a two or three-dimensional region. The region is of any part of the patient, such as a region within the chest, abdomen, leg, head, arm, or combinations thereof. For reconstruction, the data is of a reduced field of view within the patient. For coil sensitivity, the data may be of a larger region than the reduced field of view. The data is from scanning the region by the MR system 48. The memory 52 may alternatively or additionally store data during processing, such as storing Eigen information, coil sensitivity estimates, reconstruction information, coil images, and/or an output image.

The memory 52 or other memory is alternatively or additionally a computer readable storage medium storing data representing instructions executable by the programmed processor 50 for magnetic resonance reconstruction with oversampled reference scanning. The instructions for implementing the processes, methods and/or techniques discussed herein are provided on non-transitory computer-readable storage media or memories, such as a cache, buffer, RAM, removable media, hard drive or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone, or in combination. Likewise, processing strategies may include multiprocessing, multitasking, parallel processing, and the like.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

The processor 50 is a general processor, central processing unit, control processor, graphics processor, digital signal processor, three-dimensional rendering processor, image processor, application specific integrated circuit, field programmable gate array, digital circuit, analog circuit, combinations thereof, or other now known or later developed device for MR reconstruction. The processor 50 is a single device or multiple devices operating in serial, parallel, or separately. The processor 50 may be a main processor of a computer, such as a laptop or desktop computer, or may be a processor for handling some tasks in a larger system, such as in an imaging system. The processor 50 is configured by instructions, design, hardware, and/or software to be able to perform the acts discussed herein, such as SENSE reconstruction of a reduced field of view with oversampling reference scanning.

The processor 50 is configured to reconstruct a reduced field of view image of a patient with coil sensitivities for a region of the patient that is greater than the reduced field of view. By controlling the MR system 48 or by acquisition of data by transfer or loading, the processor 50 receives k-space data for a references scan. The reference scan is oversampled so that the coil sensitivities for a larger region than the reduced field of view are estimated. Any oversampling factor may be used, such as 1.5, 2.0, or 3.0. The processor 50 is configured to estimate the coil sensitivity for each of the coils to be used for reconstructing the reduced field of view.

The processor 50 is configured to reconstruct using sensitivity encoding (SENSE). The reconstruction is performed with an acceleration factor. The acceleration factor is a function of the size of the region for which coil sensitivity is provided. The acceleration factor accounts for the coil sensitivity being available for locations outside of the reduced field of view. The processor 50 reconstructs for the reduced field of view, but incorporating information on coil sensitivities from locations within and outside of the reduced field of view.

The display 54 is a monitor, LCD, projector, plasma display, CRT, printer, or other now known or later developed devise for outputting visual information. The display 54 receives images, graphics, or other information from the processor 50, memory 52, or MR system 48. One or more MR images are displayed. The images are generated within 1-5 seconds from the scanning, allowing viewing and diagnosis at the time of imaging the patient or while the patient is still in a position for further MRI. The image represents the reduced field of view, such as a portion of the patient reduced along a direction orthogonal to an axial direction. For example, FIG. 3E is generated and displayed.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A method for magnetic resonance imaging, the method comprising:
    assigning a reduced field of view for regularized sensitivity encoding (SENSE) reconstruction, the reduced field of view being reduced from an entire patient to a sub-region of the patient along at least one spatial dimension;
    performing, with a magnetic resonance system, a reference scan for the regularized sensitivity encoding (SENSE) reconstruction;
    oversampling the reference scan during the performing, the oversampling being in a direction of the reduced field of view;
    determining coil sensitivity of a coil of the magnetic resonance system from the oversampled reference scan for a field of view larger than the reduced field of view so that the determined coil sensitivity covers a region greater than the sub-region along the direction;
    performing the regularized SENSE reconstruction as a function of the coil sensitivity; and
    generating a magnetic resonance image from the SENSE reconstruction.

2. The method of claim 1 wherein assigning the reduced field of view comprises receiving user selection of a cardiac region of interest as the sub-set, and wherein generating the magnetic resonance image comprises generating for the cardiac region of interest.

3. The method of claim 1 wherein performing the reference scan comprises obtaining the k-space data with a lower resolution than k-space data used for reconstructing.

4. The method of claim 1 wherein oversampling comprises oversampling by a factor of about two.

5. The method of claim 1 wherein oversampling comprises oversampling while acquiring a same amount of k-space center as if the reference scan were performed for the reduced field of view.

6. The method of claim 1 wherein oversampling comprises oversampling with a lesser step size between lines and same number of lines than if the reference scan were performed for the reduced field of view.

7. The method of claim 1 wherein assigning comprising assigning the reduced field of view along two orthogonal dimensions, wherein oversampling comprises oversampling for the two orthogonal dimensions, and wherein determining comprises determining the coil sensitivity along the two orthogonal dimensions to a greater spatial extent than the reduced field of view on those two orthogonal dimensions.

8. The method of claim 4 wherein determining the coil sensitivity covering the region comprises determining the coil sensitivity for the region with the region being twice the reduced field of view, and wherein performing the reconstruction comprises reconstructing with an acceleration factor of a multiple of two.

9. The method of claim 1 wherein performing the reconstruction comprises parallel reconstructing with a number of coils including the coil.

10. The method of claim 9 wherein determining the coil sensitivity comprises determining the coil sensitivity for each of the coils with the region being a multiple of an oversampling factor of the oversampling and a subsampling factor, and wherein performing the reconstruction comprises reconstructing with an acceleration factor that is a function of the multiple.

11. The method of claim 1 further comprising masking the coil sensitivity for use in performing the reconstruction.

12. In a non-transitory computer readable storage medium, having stored therein data representing instructions executable by a programmed processor for magnetic resonance imaging with sensitivity encoding (SENSE) reconstruction, the storage medium comprising instructions for:
    oversampling, with a magnetic resonance system, a reference scan of a patient relative to a reduced field of view;
    determining an encoding matrix from the oversampled reference scan of the patient; and
    reconstructing an image of the patient as a function of the encoding matrix.

13. The non-transitory computer readable storage medium of claim 12 wherein oversampling comprises oversampling by a factor of two.

14. The non-transitory computer readable storage medium of claim 12 wherein oversampling comprises oversampling with a same amount of k-space center as if performing the reference scan for the entire patient along a dimension of the reduced field of view.

15. The non-transitory computer readable storage medium of claim 12 wherein determining the encoding matrix comprises estimating coil sensitivity from the oversampled reference scan, the coil sensitivity determined for a region of the patient greater than then reduced field of view due to the oversampling.

16. The non-transitory computer readable storage medium of claim 12 wherein reconstructing comprises performing the SENSE reconstruction.

17. A magnetic resonance system comprising:
a plurality of coils; and
a processor configured to reconstruct a reduced field of view image of a patient with coil sensitivities of the plurality of coils for a region of the patient that is greater than the reduced field of view, wherein the processor is configured to reconstruct with a sensitivity encoding with an acceleration factor that is a function of a size of the region.

18. The magnetic resonance system of claim 17 wherein the processor is configured to reconstruct with oversampling of a reference scan.

19. The magnetic resonance system of claim 18 wherein the processor is configured to reconstruct with the oversampling by a factor of two.

* * * * *